United States Patent
Tsai et al.

(10) Patent No.: US 6,563,752 B2
(45) Date of Patent: May 13, 2003

(54) QUALIFICATION TEST METHOD AND CIRCUIT FOR A NON-VOLATILE MEMORY

(75) Inventors: Wen-Jer Tsai, Hualian (TW); Nian-Kai Zous, Tauyuan Hsien (TW); Ta-Hui Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/945,289

(22) Filed: Aug. 30, 2001

(65) Prior Publication Data

US 2002/0036939 A1 Mar. 28, 2002

(30) Foreign Application Priority Data

Aug. 2, 2001 (TW) ........................ 90118850 A

(51) Int. Cl.[7] ............................ G11C 7/00; G11C 29/00
(52) U.S. Cl. .................... 365/201; 365/185.01
(58) Field of Search ................. 365/201, 203, 365/185.01; 714/773, 721

(56) References Cited

U.S. PATENT DOCUMENTS 5,930,169 A * 7/1999 Iwata et al. ............ 365/185.09
6,000,843 A * 12/1999 Sawada ...................... 714/721
6,339,557 B1 * 1/2002 Kawaguchi et al. ........ 365/211

* cited by examiner

*Primary Examiner*—Richard Elms
*Assistant Examiner*—Jung H. Hur
(74) *Attorney, Agent, or Firm*—J.C. Patents

(57) ABSTRACT

A qualification test method for a non-volatile memory includes determining a relation curve between the programming voltage and the lifetime of the memory cell. A programming voltage with respect to the memory array within the expected lifetime is estimated. According to the relation curve, the accelerating test voltage and the test time period corresponding to the programming voltage operated in the expected lifetime are computed out. The test is performed for the test time period under the accelerating test voltage. All the memory cells at the programmed state are tested to see if the original programmed state still remains. If the programmed state remains, the memory array is judged to have the life period. If the programmed state does not remain, the memory array is judged to have no the life period.

5 Claims, 6 Drawing Sheets

QUALIFICATION TEST METHOD AND CIRCUIT FOR A NON-VOLATILE MEMORY

CROSS-REFERENCE TO RELATED APPLICATION

This application claims the priority benefit of Taiwan application Ser. no. 90118850, filed Aug. 2, 2001.

BACKGROUND OF THE INVENTION

1. Field of Invention

The present invention relates to a test circuit and method for a non-volatile memory. More particularly, the present invention relates to a qualification test method and circuit for a non-volatile memory with a trapping layer.

2. Description of Related Art

The non-volatile memory, such as flash EEPROM, usually has the gate structure with a control gate and a floating gate. The control gate is used to receive the activating control voltage of the memory cell, and the floating gate is used to store charges. In this structure, since the floating gate is usually a conductive body made of polysilicon, when the memory cell is programmed, the injected electrons to the floating gate would be distributed uniformly in the floating gate. Therefore, this kind of memory cell with the floating gate structure can only have one bit for memory. Afterward, it is proposed that the dielectric layer is used to replace the floating gate structure of the memory cell. Electrons can be locally confined by using the dielectric layer to confine electrons, whereby two bits in one memory cell can be achieved. This increases the capacity for the memory cell.

FIG. 1 is a cross-section view, illustrating a structure of a non-volatile memory cell, have a trapping layer with two bits. In FIG. 1, the substrate includes doped regions serving as a source region 18 and a drain region 16 for a memory cell. A gate structure is formed over the substrate. The gate structure can have a structure of oxide 10/nitride 12/oxide 14. The nitride layer 12 serving as a trapping layer is used to capture electrons. Here, the channel hot electron injection and the band-to-band hot electron injection, respectively, are used to program and erase the memory cell.

Since the trapping layer 12 is not a conductive body, when electrons are trapped inside, electrons are confined to a side of the source region or the drain region. That is, when programming voltage is applied on the gate and the drain region, and the source region is applied with a voltage of 0V, a large electric field would occur at edge of the gate electrode and drain region. The electrons are trapped in the trapping layer at edge of the drain region, and are confined at the local region. On the contrary, when programming voltage is applied on the gate and the source region, and the drain region is applied with a voltage of 0V, a large electric field would occur at edge of the gate electrode and source region. The electrons are trapped in the trapping layer at edge of the source region, and are confined at the local region. In this manner, the two bits of storage is achieved, as shown in FIG. 1 for the locations bit 1 and the bit 2.

TABLE 1

|  |  | $V_g(V)$ | $V_s(V)$ | $V_d(V)$ | $V_b(V)$ |
|---|---|---|---|---|---|
| Programming | Bit 1 | 10 | 4 | 0 | 0 |
|  | Bit 2 | 10 | 0 | 4 | 0 |
| Erasing | Bit 1 | −3 | −5 | Floating | 0 |

TABLE 1-continued

|  |  | $V_g(V)$ | $V_s(V)$ | $V_d(V)$ | $V_b(V)$ |
|---|---|---|---|---|---|
|  | Bit 2 | −3 | Floating | −5 | 0 |
| Reading | Bit 1 | 2.75 | 0 | 1.6 | 0 |
|  | Bit 2 | 2.75 | 1.6 | 0 | 0 |

The operation voltage sets for different actions are shown in table 1.

The threshold voltage Vt of this kind of memory cell can be increased after the electrons are injected into the insulating layer 12 (program state). However, after the memory cell passes the program/erase cycle (P/E cycle), the threshold voltage of the programming state would reduce as the retention time increases. The lowered threshold voltage would increase the leakage current, and even cause a failure of storing information in the memory cell. For example, for the usual situation that the state of "0" has a threshold voltage higher than a specified level, the state of "1" and state of "0" cannot be correctly distinguished due to the reduced threshold voltage. This means that the information stored in the memory cell cannot be correctly read out.

Thus, in order to assure the memory to work properly for a long period after the memory cell is fabricated and packaged, and then sent to the user. A test is necessary to be performed, so as to ensure that the product can still properly work without invalidity after a long period of retention time even if the threshold voltage is reduced.

SUMMARY OF THE INVENTION

The invention uses the physical phenomena for an insulating trapping layer in the non-volatile memory and provides an effective testing method associate with an apparatus. The invention is an accelerating test performed in a period of test time, and can judge whether or not the memory array can properly work in an expected lifetime.

The invention provides a qualification test method for a non-volatile memory. First, a relation curve between the programming voltage and the lifetime of the memory cell is determined. Then, a programming voltage with respect to the memory array within the expected lifetime is estimated. According to the relation curve, the accelerating test voltage and the test time period corresponding to the programming voltage operated in the expected lifetime are computed out. The test is performed for the test time period under the accelerating test voltage. All the memory cells of the memory array at the programmed state are tested to see if the memory cells still have the original programmed state after the test time period. If the programmed state of all the memory cells in the memory array remains, the memory array is judged to have the lifetime. If the programmed state of partial of the memory cells in the memory array does not remain, the memory array is judged to fail during its lifetime.

The invention further provides a qualification test circuit for a non-volatile memory, used to test a memory array, which includes multiple memory cells arranged in columns and rows. Each of the rows is connected to a word line driver, and each of the columns is connected to a bit line bias circuit. The qualification test circuit for a non-volatile memory includes a programming voltage testing control unit, coupled to the memory array, used to test the programming state for each memory cell.

By means of foregoing accelerating test method and circuit, the accelerating programming voltage is used to test all the memory cells with the expected testing time period. After the expected testing time period, the programming state for the memory cells is checked whether or not the programming state still remain. If it is, then the memory cells are qualified to be able to properly work under the actual programming voltage within the expected lifetime. The invention thereby achieves the objective for the qualification test.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
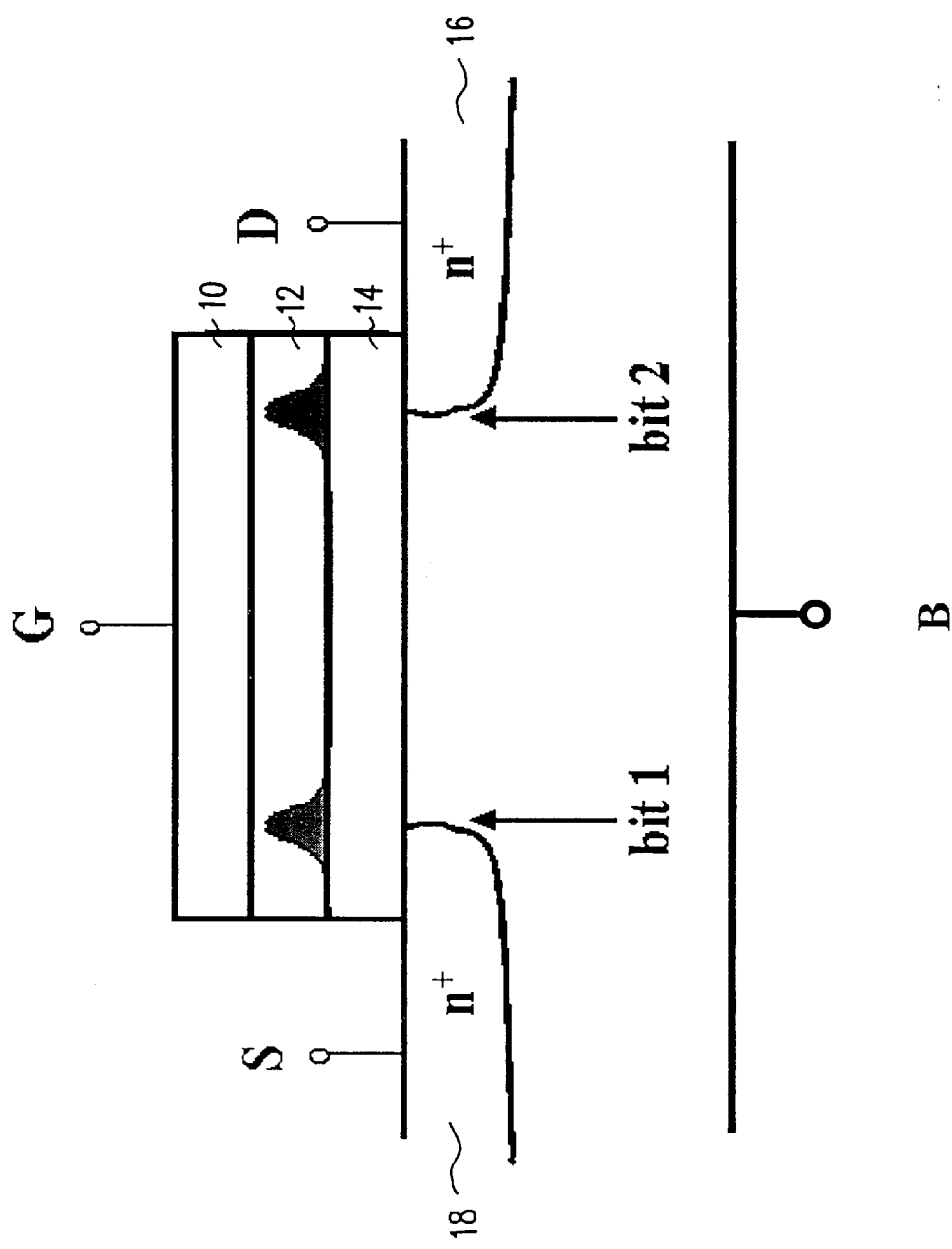
FIG. 1 is a cross-section view, illustrating a structure of a non-volatile memory cell, have a trapping layer with two memory bits.
Figure 2:
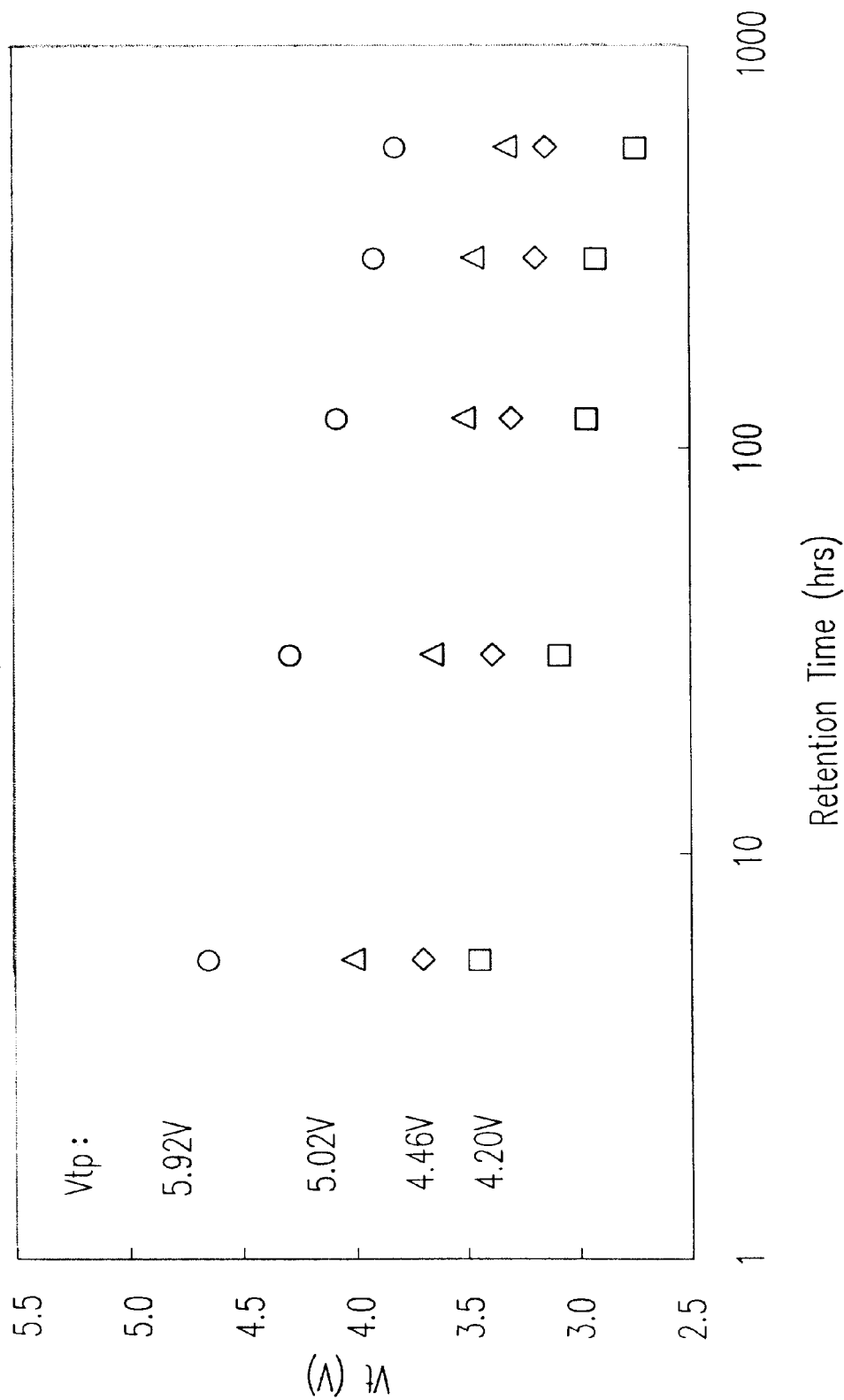
FIG. 2 are the relation curves for the threshold voltage versus the retention time, under several programming voltages (Vtpgm), according to one preferred embodiment of this invention.

First, FIG. 2 are the relation curves for the threshold voltage Vt versus the retention time, under several programming voltages (Vtpgm, or Vtp), according to one preferred embodiment of this invention. In FIG. 2, for example, if the Vtp is at 5.92 V, then the threshold voltage Vt would vary from about 4.75 V to about 3.75 V as the retention time varies from 8 hours to 900 hours. According to FIG. 2, it is easily seen that the varying relation of the threshold voltage Vt and the retention time is a logarithmic relation and is about linear proportion. As the retention time get longer, the threshold voltage get smaller.

Taking FIG. 2 as an example, the threshold voltage (Vt) reduction rate is insensitive to Vtpgm, e.g.

$$\frac{dV_t}{d\log(t)} \approx 0.14 \ dV_{tpgm}.$$

In other words, under the same failure criteria, for example, using Vt=2.5 V as a standard for failure judgment, when the programming voltage Vtp is higher, the corresponding lifetime gets shorter. The failure criteria is defined as the critical level, in which if the threshold voltage is lower than it, then the programmed states of "1" or "0" for the stored information in the memory cell are not able to be distinguished. In this situation, the memory cell becomes invalid.

In FIG. 2, For example, when the programming voltage Vtp is 4.2 V, the threshold voltage varies from about 3.5 V down to about 2.7 V. This means that when the retention time is over 1000 hours, the threshold voltage Vt has approached to the failure criteria of 2.5 V. This also indicated that if the programming voltage Vtp is at 4.2 V, the lifetime of the memory product is only about 1000 hours. Alternatively, when the programming voltage Vtp is at 5.92 V, the threshold voltage varies from about 4.75 V down to about 3.75 V. In this situation, the threshold voltage is still much larger than the failure criteria. This indicates that the lifetime is much longer than that the condition with the programming voltage Vtp of 4.2 V.

Figure 3:
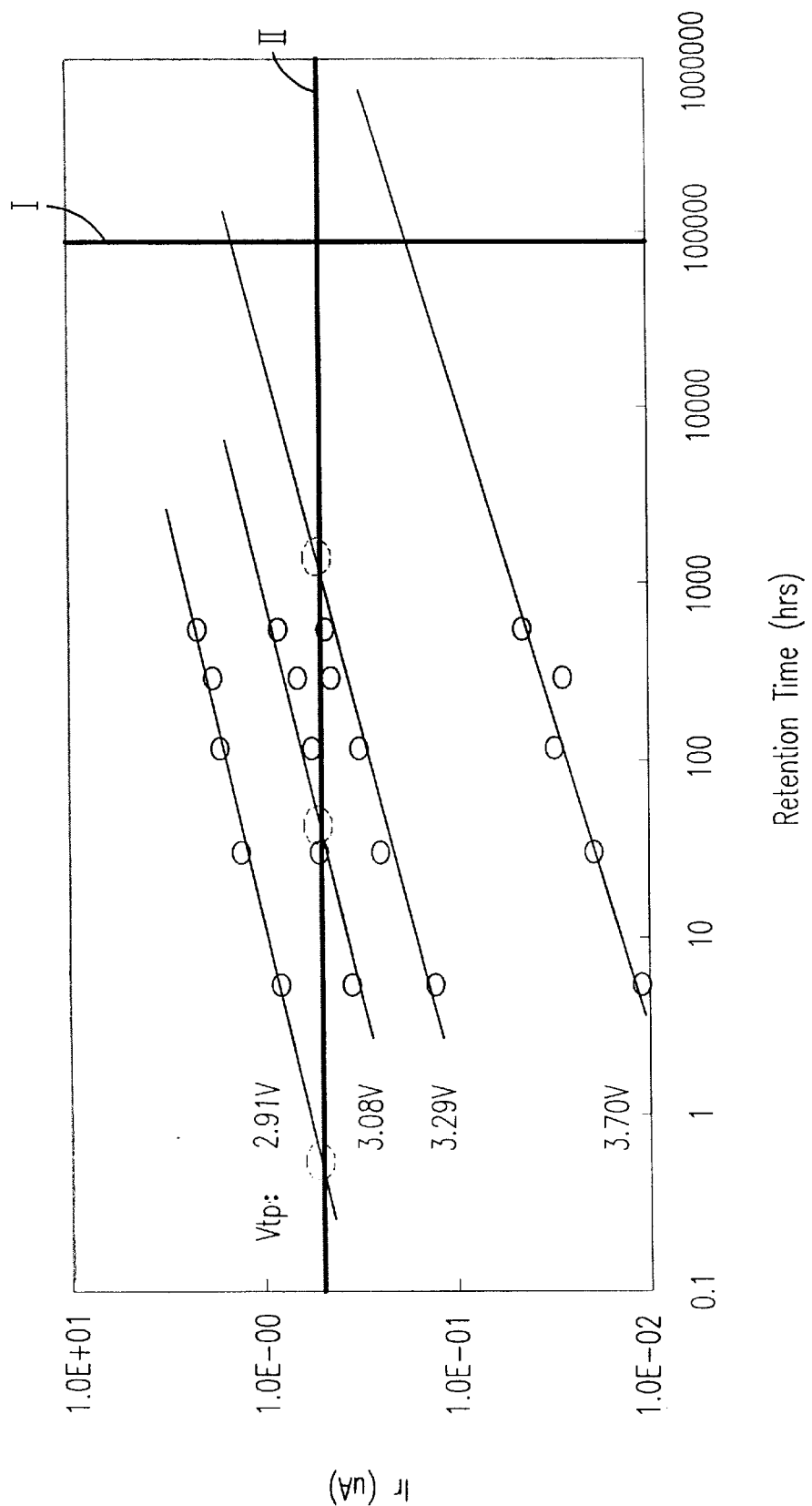
FIG. 3 are the relation curves for the leakage current versus the retention time, under several programming voltages, according to one preferred embodiment of this invention.

FIG. 3 are the relation curves for the leakage current versus the retention time, under several programming voltages, according to one preferred embodiment of this invention. In FIG. 3, under several different programming voltages, that is, Vtpgm is in the range of 2.91V–3.7 V, the leakage current Ir ($\mu$A) is detected. The failure criteria for indicating invalid memory cell on the leakage current is, for example, set to Ir=0.5 $\mu$A, which is marked by line II in FIG. 3. When the leakage current is greater than 0.5 $\mu$A, the stored state in the memory cell then cannot be correctly distinguished. Moreover, the line I represents the lifetime of the memory cells is 10 years.

As shown in FIG. 3, it is clearly seen that as the programming voltage Vtp is larger, the corresponding retention time is accordingly longer. For the example of Vtp=2.91 V, the leakage current has been over the failure criteria of Ir=0.5 $\mu$A after 1 hour of retention, causing the invalidity of the memory cell. For another example of Vtp=3.29 V, the retention time can last for about 1000 hours. However, the memory cell becomes invalid after 1000 hours because the leakage current has over the criteria of Ir=0.5 $\mu$A. For the case of Vtp=3.7V, the retention time can last for 10 years (indicated by line I), and the leakage current is still less than the criteria of Ir=0.5 $\mu$A. This also means that the memory cell with the programming voltage of Vtp=3.7 V, the lifetime of the memory cell can be over 10 years.

Figure 4:
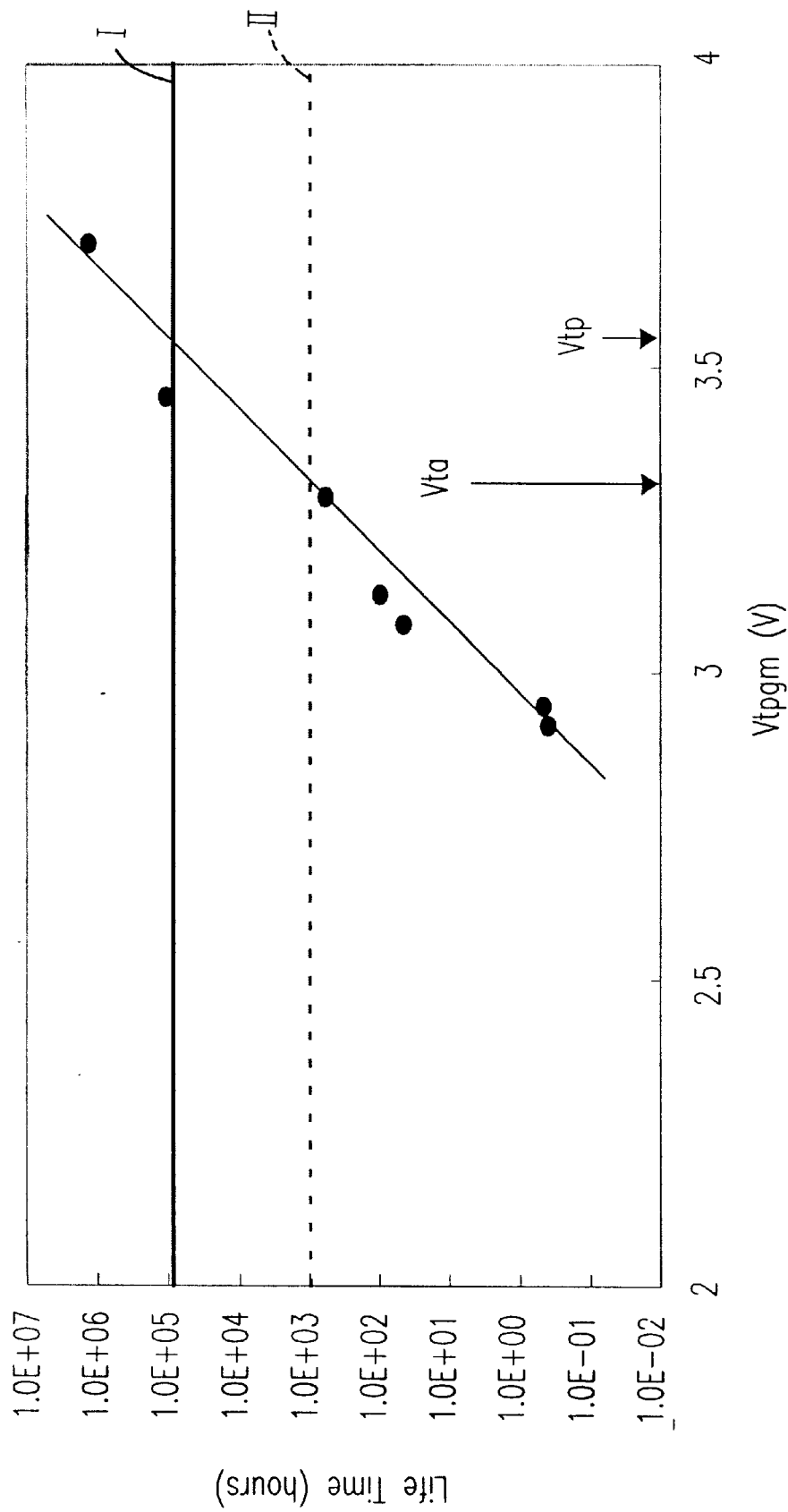
FIG. 4 are the relation curve for the lifttime versus the programming voltage, according to one preferred embodiment of this invention.

FIG. 4 are the relation curve for the lifetime versus the programming voltage, according to one preferred embodiment of this invention. In FIG. 4, the combination results of FIG. 2 and FIG. 3 are shown. It is clearly seen that the lifttime of memory cell (that is retention time) is about linearly proportional to the programming voltage Vtpgm. The invention would base on the relation in FIG. 4 to perform an accelerating test. The accelerating test includes using an accelerating programming voltage Vta to test all the memory cells during an expected period of testing time. After the expected period of testing time, the programmed state stored in the memory cells are checked to see if the program state remains. If program state remains, a conclusion is made that all the memory cells can correctly work within the expected lifetime under the relative higher programming voltage Vtp.

As shown in FIG. 4, since the lifetime of the memory cell (retention time) and the programming voltage Vtpgm roughly has a linear relation in logarithm scale for the lifetime, if a certain programming voltage Vtpgm with the expected lifetime as indicated by line I is desired, an accelerating programming voltage Vta with lower voltage level can be performed, as indicated by line II.

According to FIG. 4, if the actual programming voltage Vtp to be operated in the future is, for example, 3.6 V, the expected lifetime is about $10^5$ hours, equivalent to 10 years. Based on the slop of the linear relation, the accelerating programming voltage Vta can be set at 3.3 V, which corresponds to an expected lifetime of $10^3$ hours, which is also the testing time period (see line II).

Then, a qualification test on the memory cells is performed, that is, the memory cells are tested to determine whether or not the memory cells have the estimated lifetime. For the actual qualification test, it is not necessary to go fully test for the estimated lifetime. However, a shorter test time is sufficient to assure the actual lifttime. In the example, it only needs $10^3$ hours for test. This is called accelerating test. We can continuously apply a chosen accelerating programming voltage on the whole memory cells for the corresponding lifetime. After that, the programmed state of the memory cells is checked to see if it remains. If the programmed state on the memory cells under the accelerating programming voltage Vta=3.3 V for $10^3$ hours can still remain as the original programmed state, the memory cells have passed the qualification test.

Based on the linear relation between the Vtpgm and lifetime in FIG. 4, the memory cells are expected to have lifetime of 10 years under the programming voltage of 3.6 V when the accelerating programming test has passed.

Therefore, using the foregoing method, the actual lifetime can be tested with greatly shorter test time with lower accelerating programming voltage.

Figure 5:
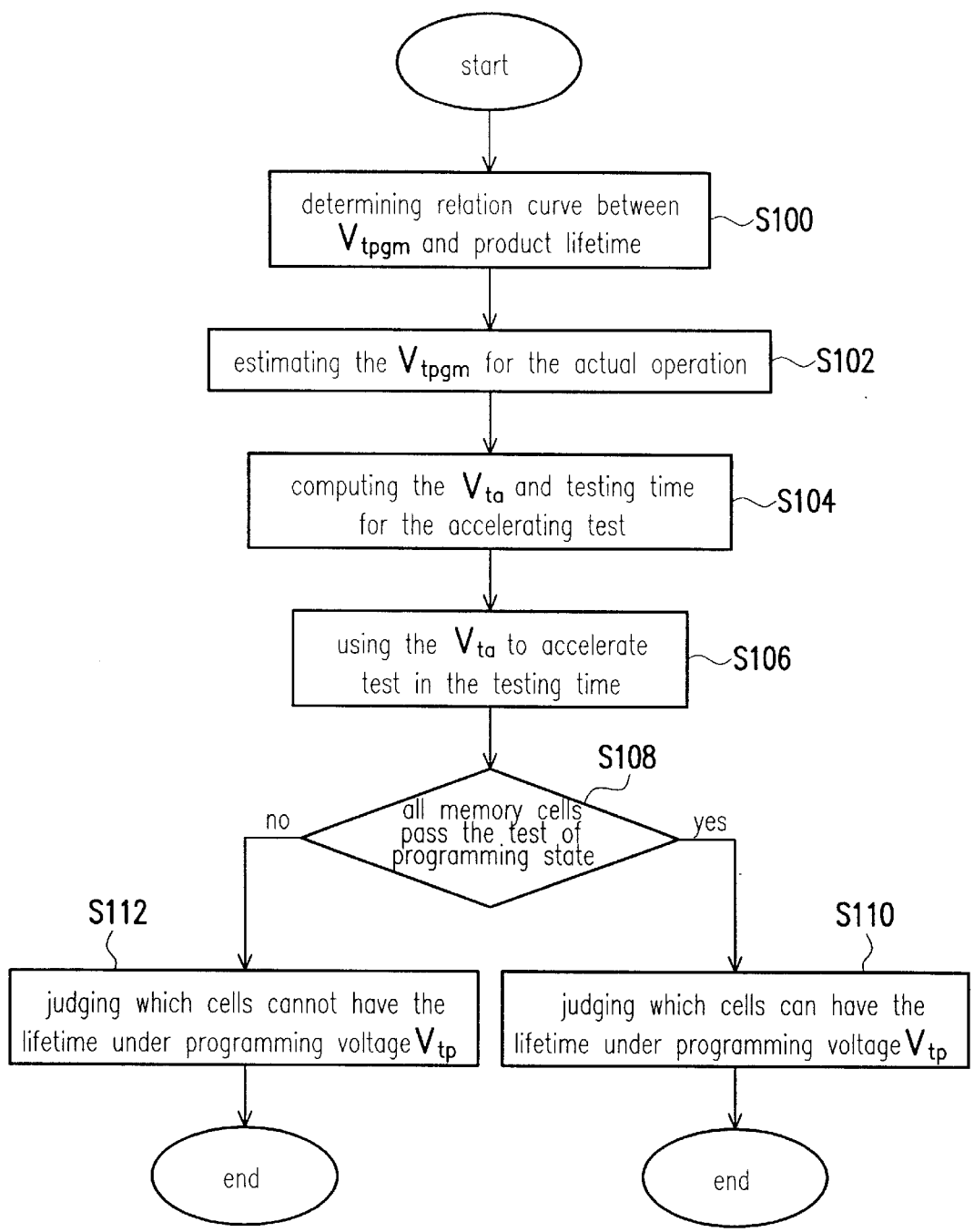
FIG. 5 is the flow diagram, schematically illustrating the qualification test method for the non-volatile memory, according to one preferred embodiment of this invention.

FIG. 5 is the flow diagram, schematically illustrating the qualification test method for the non-volatile memory, according to one preferred embodiment of this invention. In FIG. 5, after start, the step S100 is to determine the relation between the programming voltage Vtpgm and the lifetime of the product, such as the relation as shown in FIG. 4.

In the step S102, the actual programming voltage to be operated in the future is estimated, such as the lifetime of 10 years with respect to the programming voltage Vtp of 3.6 V as shown in FIG. 4. In the step S104, according to the relation obtained in the step S100, an accelerating programming voltage with respect to the testing time period are computed out, such as Vta=3.3 V for testing time period of 1000 hours as shown in FIG. 4.

In the step S106, the accelerating test is performed under the accelerating programming voltage, i.e., Vta=3.3 V for the corresponding test time of, i.e., 1000 hours. After 1000 hours of test, the step S108 is to check whether or not the programmed state stored originally in the memory cells remains.

If the programmed state of all the memory cells still remain after test period of 1000 hours, the flow goes to the step S110, which gate a conclusion that the memory product can correctly work with the coming, i.e., 10 years under the programming voltage Vtp. If the programmed state for some of the memory cells has changed, it get conclusion in the step S112 that lifetime of the product cannot last for 10 years.

Figure 6:
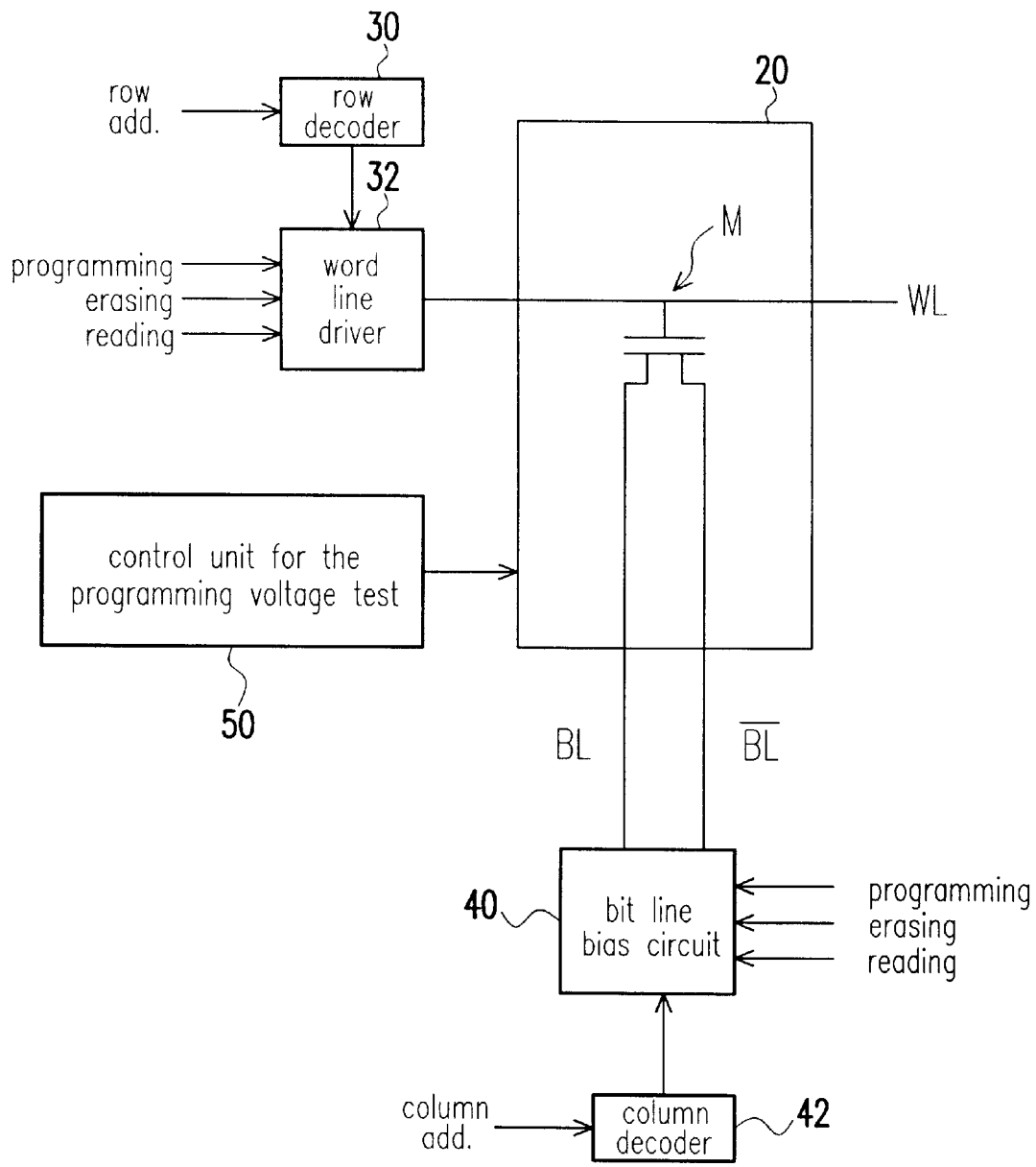
FIG. 6 is circuit diagram, schematically illustrating the circuit to perform the qualification test method for the non-volatile memory, according to one preferred embodiment of this invention.

In summary, using the forgoing accelerating test method, the lifetime of product can be effectively estimated FIG. 6 is circuit diagram, schematically illustrating the circuit to perform the qualification test method for the non-volatile memory, according to one preferred embodiment of this invention. In FIG. 6, a flash memory array 20 is shown, in which only one memory cell M is drawn as an example. The person skilled in the art should know that the memory cells of flash memory are arranged into several columns and rows. Multiple bit lines each connect the source regions of the memory cells in the same columns. Likewise, multiple word lines each connect the gate electrodes of the memory cells in the same rows. Each word line WL is connected to the word line drivers 32. The word line driver 32 also provides actions for programming, erasing, and reading. A row decoder 30 is coupled to the word line driver 32 used to receive a row address and decode the row address, and then export the address information to the word line driver 32 to choose the memory cells. A bit line bias circuit 40 is coupled to each of the bit lines BL's and used to perform action of programming, erasing, and reading. A column decoder 42 is coupled to the bit line bias circuit 40, is used to receive an column address and decode it. The column decoder 42 exports the column address to the bit line bias circuit 40 for choosing and applying needed bias to the memory cells on the chosen column.

A programming test control unit 50 is coupled to the memory array 20, used to check the programmed state for each memory cell in the memory array 20. The memory cells are programmed to the programmed state under the accelerating programming voltage Vta for the corresponding testing period. After the testing period, the programmed state on the memory cells is checked by the programming test control unit 50 to see if all the memory cells remain the original programmed state. If all the memory cells can remain the program state, it assures that the memory product has the expected lifetime under the desired programming voltage. On the contrary, if some of the memory cells cannot remain the programmed state, it implies that the memory product may not have the expected lifetime.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A qualification test method for a non-volatile memory, comprising:

determining a relation curve between a programming voltage parameter and a retention lifetime parameter of a memory array;

estimating a programming voltage for an expected retention lifetime for the memory array;

according to the relation curve, choosing an accelerating programming voltage to which corresponds a testing retention lifetime that is shorter than the expected retention lifetime, wherein the testing retention lifetime corresponds to a testing time period;

testing the memory array by continuously applying the accelerating programming voltage on the memory array for the testing time period; and checking each of memory cells of the memory array to verify whether a programmed state stored on the memory cells remains, wherein if the programmed state of all the memory cells remains without change, the memory array is concluded as having the expected retention lifetime under the programming voltage, and if the programmed state of some of the memory cells is changed, the memory array is concluded as not having the expected retention lifetime under the programming voltage.

2. The method of claim 1, wherein the relation curve between the programming voltage parameter and the retention lifetime parameter is approximately linear in logarithm scale.

3. A qualification test method for a non-volatile memory, comprising:
- determining a programming voltage with respect to an expected retention lifetime for a memory array, based on a relation between the programming voltage and the corresponding retention lifetime;
- computing out an accelerating programming voltage with respect to a testing retention lifetime of the memory array that is shorter than the expected retention lifetime, wherein the testing retention lifetime is a testing time period;
- using the accelerating programming voltage to test the memory array for the testing time period; and
- checking each of memory cells of the memory array to verify whether a programmed state stored on the memory cells remains.

4. The method of claim 3, wherein the relation between the programming voltage and the corresponding retention lifetime is approximately linear in logarithm scale.

5. A qualification test circuit for a non-volatile memory, used to test a memory array and determine whether the memory array has an expected retention lifetime, wherein the memory array includes a plurality of memory cells that form rows and columns, wherein each of the rows is coupled to a word line driver and each of the columns is coupled to a bit line bias circuit, the qualification test circuit comprising:
- a programming voltage test control unit, coupled to the memory array and used to check a program state stored in memory cells of the memory array, wherein the program state is programmed by applying an accelerating programming voltage for a testing time period, and the memory array has the expected retention lifetime if the program state remains unchanged after the testing time period.

* * * * *